United States Patent [19]

Okuda et al.

[11] Patent Number: 4,739,319

[45] Date of Patent: Apr. 19, 1988

[54] BAR GRAPH DISPLAY APPARATUS

[75] Inventors: Hideki Okuda, Obu; Jukichi Nagasawa, Ebina, both of Japan

[73] Assignees: Nippondenso Co., Ltd, Kariya; Isuzu Motors Limited, Tokyo, both of Japan

[21] Appl. No.: 763,987

[22] Filed: Aug. 9, 1985

[30] Foreign Application Priority Data

Aug. 11, 1984 [JP] Japan ................. 59-168465

[51] Int. Cl.⁴ .............................................. G09G 3/00
[52] U.S. Cl. ..................................... 340/753; 340/719
[58] Field of Search ................. 340/753, 754, 718, 719

[56] References Cited

U.S. PATENT DOCUMENTS

| | | | |
|---|---|---|---|
| 3,644,784 | 2/1972 | Dickey et al. | 340/753 |
| 3,833,936 | 9/1974 | Wilson | 340/753 |
| 3,914,758 | 10/1975 | Ingle | 340/753 |
| 4,253,096 | 2/1981 | Kmetz | 340/753 |
| 4,488,149 | 12/1984 | Givens, Jr. | 340/715 |
| 4,570,226 | 2/1986 | Aussedat | 340/754 |

FOREIGN PATENT DOCUMENTS 55-71911  5/1980  Japan.
55124009  9/1980  Japan.

Primary Examiner—Marshall M. Curtis
Attorney, Agent, or Firm—Cushman, Darby & Cushman

[57] ABSTRACT

In a display apparatus including a plurality of scaling display elements and a plurality of bar graph display elements, each of the scaling display elements is changed from its ON state to its OFF state when an adjacent bar graph display element is changed from its OFF state to its ON state and restored from the OFF state to the ON state when the adjacent bar graph display element is changed from the ON state, respectively to the OFF state.

8 Claims, 2 Drawing Sheets

BAR GRAPH DISPLAY APPARATUS

BACKGROUND OF THE INVENTION

1. Field of the Invention

The present invention relates to a bar graph display apparatus for displaying a quantity of information in the form of a bar graph.

2. Description of the Prior Art

In prior art bar graph display apparatuses a bar graph display unit includes a plurality of bar graph display elements arranged in the form of bars and scaling marks which are arranged on the side of selected bar graph display elements so as to allow a quantity of information to be viewed in accordance with the relative position between the marks and the display elements. However, this known apparatus is disadvantageous in that if only the bar graph display unit is viewed, it is impossible to determine the position of its scale. Therefore, it is difficult to determine the quantity of information.

SUMMARY OF THE INVENTION

In order to overcome the foregoing deficiencies in the prior art, it is an object of this invention to provide an improved bar graph display apparatus in which a bar graph display unit includes a plurality of scaling bar graph display elements such that the amount of information can be determined from the positional relation between the scaling bar graph display elements and the other bar graph display elements by simply looking at the bar graph display unit. The scaling bar graph display elements also are made easier to perceive than the other bar graph display elements.

To accomplish the above object, in accordance with the present invention there is thus provided a bar graph display apparatus including: display means having a plurality of bar graph display elements including a plurality of scaling bar graph display elements arranged in the form of a bar graph, each of the display elements being switchable between display and non-display conditions; drive means for driving a given number of the bar graph display elements of the display means into a continuous display from a predetermined lower position; and means for maintaining each of the scaling bar graph display elements of the display means in a display condition opposite to that of an adjacent bar graph display element.

Thus, in accordance with the present invention, the fact that the bar graph display unit includes the scaling bar graph display elements makes it possible to easily determine from the display the amount of information based upon the positional relation between the scaling bar graph display elements and the other bar graph display elements by simply looking at the bar graph display unit. Furthermore, since each of the scaling bar graph display elements is held in a display condition opposite to that of adjacent bar graph display elements, it is possible to more easily perceive the scaling bar graph display elements than the other bar graph display elements.

DESCRIPTION OF THE PREFERRED EMBODIMENTS

Figure 1:
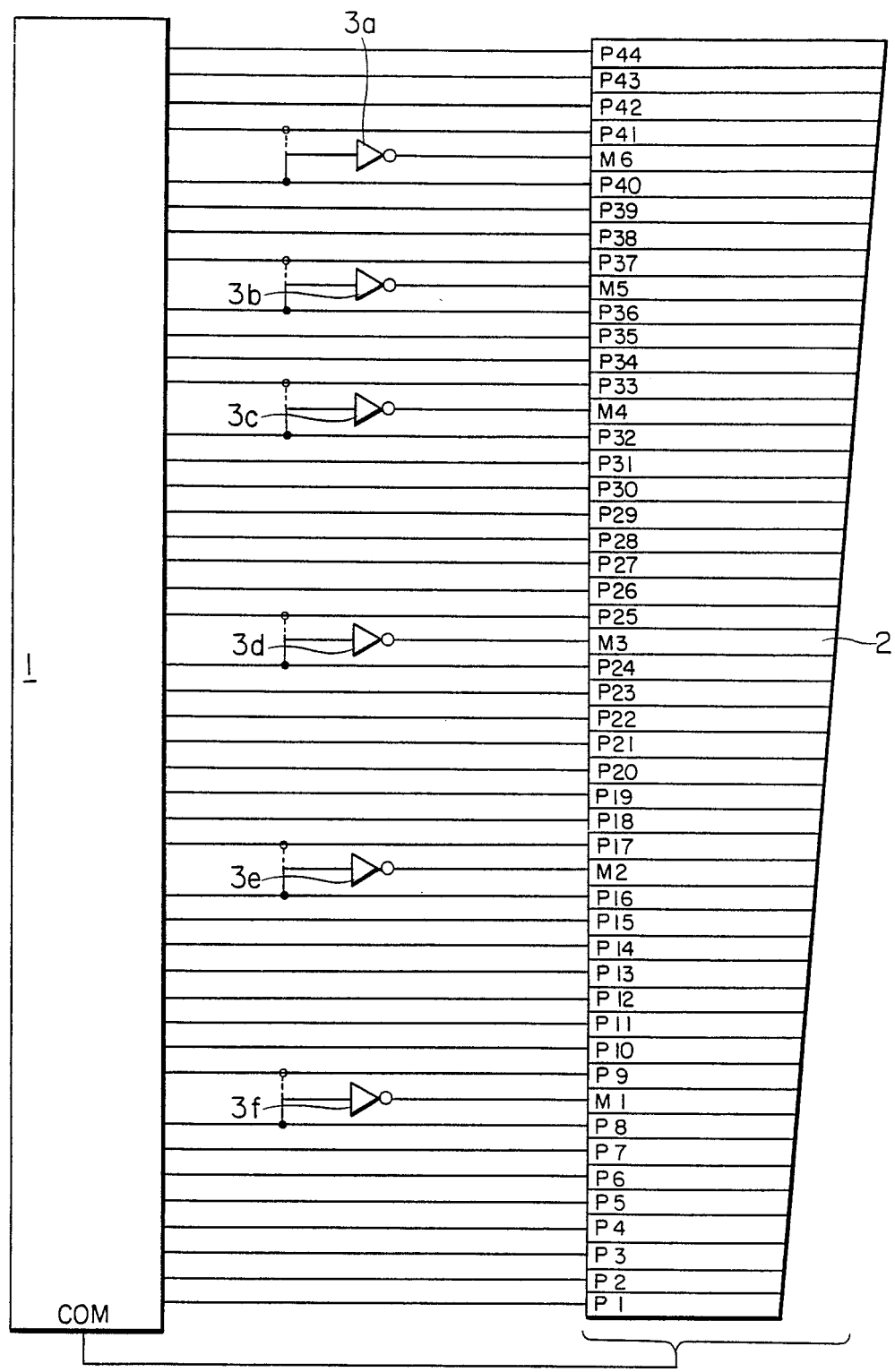
FIG. 1 is a wiring diagram showing an embodiment of the present invention.
Figure 2:
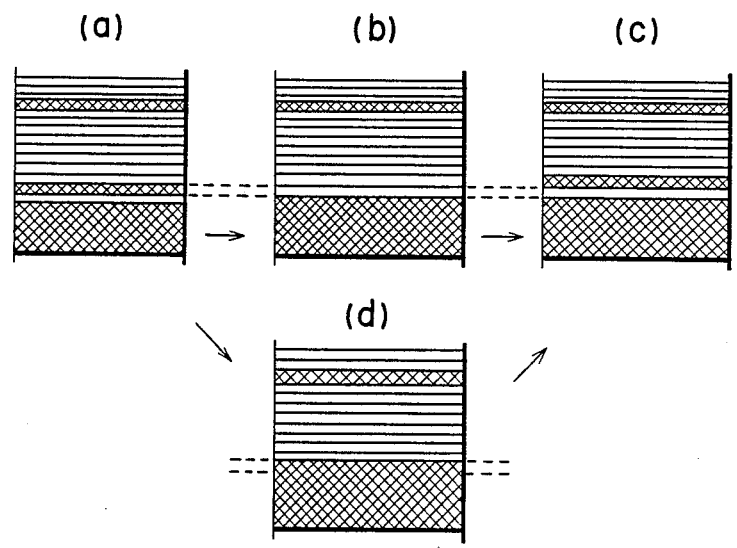

The present invention will now be described in greater detail with reference to the illustrated embodiment. FIG. 1 is a wiring diagram showing the embodiment. In the Figure, numeral 1 designates a conventional liquid crystal drive circuit of the static drive type (designated at COM is a common terminal), and 2 designates a liquid crystal display unit for bar graph displaying purposes which is composed of a plurality of display segments. In this liquid crystal display unit 2, the display segments designated by symbols $P_1$ to $P_{44}$ are used for the purpose of displaying a quantity of information on a bar graph, and those designated by symbols $M_1$ to $M_6$ are for scale displaying purposes. Numerals $3a$ to $3f$ designate inverters for driving each of the scaling display segments $M_1$ to $M_6$ into a display condition opposite to that of associated display elements $P_8$, $P_{16}$, $P_{24}$, $P_{32}$, $P_{36}$ and $P_{40}$. Thus, the scaling display segments $M_1$ to $M_6$ are made opposite in display condition to the adjacent display segments $P_8$, $P_{16}$, $P_{24}$, $P_{32}$, $P_{36}$ and $P_{40}$. More specifically, the inverters $3a$ to $3f$ are operated so that each of the scaling display segments is turned on when the adjacent display element is turned off, and conversely, it is turned off when the adjacent display segment is turned on. The state of each scaling display segment changes as shown in (a), (b) and (c) of FIG. 2 in the course of the increase of the bar graph display.

Figure 3:
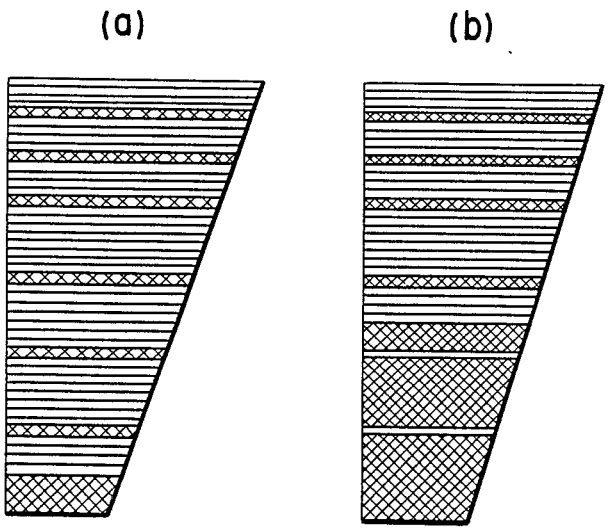
FIGS. 2 and 3 illustrate display pattern diagrams useful for explaining the operation of the embodiment shown in FIG. 1.

Thus, in the case of a bar graph display in which the display segments $P_1$ to $P_4$ are turned on as shown in (a) of FIG. 3, the scaling display segments $M_1$ to $M_6$ are all turned on. Also, in the case of a bar graph display in which the display segments $P_1$ to $P_{20}$ are turned on as shown in (b) of FIG. 3, the scaling display segments $M_1$ and $M_2$ are turned off, whereas the scaling display segments $M_3$ to $M_6$ are turned on. As will be seen from these exemplary displays, the scaling display segments can be easily perceived in any bar graph display condition.

As described in the above-described embodiment, each of the scaling display segments is held in a display condition opposite to that of the adjacent display segment on the lower side thereof; the connections of the inverters $3a$ to $3f$ may be changed as shown by the broken lines in FIG. 1 such that each of the scaling display segments is made opposite in display condition to the adjacent display segment on the upper side thereof. In this case, the state of each scaling display segment changes as shown in (a), (d) and (c) of FIG. 2, respectively in the course of an increase in the bar graph display.

Further, while the liquid crystal drive circuit is driven statically, the circuit also may be driven dynamically.

Still further, while the liquid crystal display unit is used for bar graph displaying purposes, any other display unit such as a fluorescent display unit, CRT display unit, or electroluminescent display unit may be used.

We claim:

1. A bar graph display apparatus comprising:

first display means including a plurality of bar display elements arranged in a column, a display condition of each of said plurality of bar display elements being variable;

second display means including a plurality of scale display elements respectively interposed at predetermined intervals among said plurality of bar display elements of said first display means for one end of said column to the other, a display condition of each of said plurality of scale display elements being variable;

first drive means for driving said bar display elements according to an amount of information to be displayed, wherein adjacent bar display elements at one end of said column are successively activated for bar graph display towards the other end of said column in accordance with a change in the amount of information to be displayed; and second drive means for driving all of said plurality of scale display elements of said second display means such that all of said plurality of scale display elements are driven into a display condition different from a display condition of at least one adjacent bar display element of said first display means.

2. A bar graph display apparatus according to claim 1, wherein said second drive means includes inverters for inverting drive signals from said first drive means which are supplied to said adjacent bar display elements.

3. A bar graph display apparatus according to claim 1, wherein said first drive means includes means for turning on said bar display elements according to the amount of information to be displayed such that adjacent bar display elements at said one end of said column are successively activated for display towards the other end of said column and for turning off the rest of said bar display elements of said first display means, thereby displaying an area corresponding to the amount of information to be displayed, said area being formed by said bar display elements at said one end of said column which are activated.

4. A bar graph display apparatus according to claim 1, wherein each of said bar display elements has an elongate shape, said bar display elements being arranged in parallel with each other so as to form said column.

5. A bar graph display apparatus according to claim 4, wherein each of said scale display elements has an elongate shape, said scale display elements being arranged in parallel with said bar display elements at said predetermined intervals from said one end of said column to the other.

6. A bar graph display apparatus according to claim 1, wherein said predetermined intervals include a predetermined number of said bar display elements.

7. An apparatus according to claim 1, wherein said second drive means changes said scale display elements of said second display means from an energized state to a deenergized state when an adjacent bar graph display element on the side of said scale display elements toward said one end of said column is energized and restores said scale display elements from the deenergized state to the energized state when said adjacent bar graph display element on said side toward said one end of said column of said scale display elements is deenergized.

8. An apparatus according to claim 1, wherein said second drive means changes said scale display elements of said second display means from an energized state to a deenergized state when an adjacent bar graph display element on the side of said scale display elements toward the other end of said column is energized and restores said scale display elements from the deenergized state to the energized state when said adjacent bar graph display element on said side toward said other end of said column of said scale display elements is deenergized.

* * * * *